United States Patent
Zhao et al.

(10) Patent No.: US 11,839,135 B2
(45) Date of Patent: Dec. 5, 2023

(54) DISPLAY DEVICE AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Erjin Zhao, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 700 days.

(21) Appl. No.: 16/957,572

(22) PCT Filed: Aug. 2, 2019

(86) PCT No.: PCT/CN2019/099038
§ 371 (c)(1),
(2) Date: Jun. 24, 2020

(87) PCT Pub. No.: WO2021/022405
PCT Pub. Date: Feb. 11, 2021

(65) Prior Publication Data
US 2022/0376216 A1    Nov. 24, 2022

(51) Int. Cl.
*H10K 71/00* (2023.01)
*H10K 50/87* (2023.01)
(Continued)

(52) U.S. Cl.
CPC ............ *H10K 71/00* (2023.02); *H10K 50/87* (2023.02); *H10K 59/1201* (2023.02); *H10K 59/122* (2023.02); *H10K 2102/311* (2023.02)

(58) Field of Classification Search
CPC .... H10K 71/00; H10K 50/87; H10K 59/1201; H10K 59/122; H10K 2102/311; H10K 59/87; G09F 9/30
See application file for complete search history.

(56) References Cited

U.S. PATENT DOCUMENTS 9,793,512 B2    10/2017  Choi et al.
10,043,835 B2   8/2018   Saeki
(Continued)

FOREIGN PATENT DOCUMENTS

CN    105009188 A    10/2015
CN    106940966 A    7/2017
(Continued)

OTHER PUBLICATIONS

First Japanese Office Action dated Apr. 3, 2023; Appln. No. 2019-565536.

*Primary Examiner* — J. E. Schoenholtz (57) ABSTRACT

A display device and a manufacturing method thereof are provided. The display device includes a flexible panel and a protective film. The flexible panel includes a first panel part, a second panel part, and a bendable part connected between the first panel part and the second panel part. The protective film is bonded to a surface on a non-display side of the flexible panel, and includes a first film part bonded to the first panel part and a second film part bonded to the second panel part. The flexible panel is bent at the bendable part so that the first panel part and the second panel part are overlapped in a first direction perpendicular to the surface.

12 Claims, 7 Drawing Sheets

(51) Int. Cl.
  *H10K 59/122* (2023.01)
  *H10K 59/12* (2023.01)
  *H10K 102/00* (2023.01)

(56) References Cited

U.S. PATENT DOCUMENTS

| | | | |
|---|---|---|---|
| 10,600,991 B2 | 3/2020 | Kwon et al. | |
| 10,693,089 B2 | 6/2020 | He et al. | |
| 11,011,713 B2 | 5/2021 | Chu | |
| 11,069,762 B2 * | 7/2021 | Chung | H05K 1/189 |
| 2014/0183473 A1 * | 7/2014 | Lee | H01L 51/0097 |
| | | | 257/40 |
| 2015/0137102 A1 | 5/2015 | Yang | |
| 2017/0271616 A1 | 9/2017 | Choi et al. | |
| 2017/0352834 A1 * | 12/2017 | Kim | H01L 51/5253 |
| 2018/0097199 A1 * | 4/2018 | Jo | H01L 51/5253 |
| 2018/0309086 A1 | 10/2018 | Li et al. | |
| 2018/0315809 A1 * | 11/2018 | Kim | H01L 27/1218 |
| 2018/0337220 A1 * | 11/2018 | Kim | H10K 59/12 |
| 2019/0207130 A1 | 7/2019 | He et al. | |

FOREIGN PATENT DOCUMENTS

| | | |
|---|---|---|
| CN | 107221606 A | 9/2017 |
| CN | 107464887 A | 12/2017 |
| CN | 108198842 A | 6/2018 |
| CN | 108598263 A | 9/2018 |
| CN | 108777112 A | 11/2018 |
| CN | 109377877 A | 2/2019 |
| CN | 109461378 A | 3/2019 |
| CN | 109728057 A | 5/2019 |
| CN | 109859642 A | 6/2019 |
| JP | 2018010216 A | 1/2018 |
| KR | 20190060904 A | 6/2019 |

* cited by examiner

DISPLAY DEVICE AND MANUFACTURING METHOD THEREOF

TECHNICAL FIELD

Embodiments of the present disclosure relate to a display device and a manufacturing method thereof.

BACKGROUND

Display devices with flexible panels including curved areas have been developed. For example, in order to realize the narrow-bezel design of the display device, one end of the flexible panel connected to an external circuit may be bent (or turned over) toward the back side of the panel.

SUMMARY

At least one embodiment of the present disclosure provides a display device, comprising: a flexible panel and a protective film. The flexible panel includes a first panel part, a second panel part, and a bendable part connected between the first panel part and the second panel part. The protective film is bonded to a surface on a non-display side of the flexible panel and including a first film part bonded to the first panel part and a second film part bonded to the second panel part. The flexible panel is bent at the bendable part so that the first panel part and the second panel part are overlapped in a first direction perpendicular to the surface. A distance from a first edge of the first film part near the second film part to a first boundary between the first panel part and the bendable part is a first distance; a distance from a second edge of the second film part near the first film part to a second boundary between the second panel part and the bendable part is a second distance, a sum of the first distance and the second distance is greater than 0, and both the first distance and the second distance are not less than 0.

For example, in some embodiments, the first distance is equal to 0.

For example, in some embodiments, the second distance is equal to 0.

For example, in some embodiments, both the first distance and the second distance are greater than 0.

For example, in some embodiments, the flexible panel also includes a first alignment mark disposed in the first panel part and a second alignment mark disposed in the second panel part, the first alignment mark and the second alignment mark are configured for alignment in a process of bending the bendable part.

For example, in some embodiments, at least one of the first distance or the second distance is greater than or equal to a sum of an absolute value of a maximum alignment deviation for aligning the first alignment mark and the second alignment mark and an absolute value of a maximum preparing deviation of a width of an opening between the first film part and the second film part.

For example, in some embodiments, at least one of the first distance or the second distance is within a range of greater than 0 and less than or equal to 200 μm.

For example, in some embodiments, the display device further comprises a heat dissipation film. The heat dissipation film is disposed between the first film part and the second film part in the first direction, and covers the entire first film part.

For example, in some embodiments, the flexible panel is bent at the bendable part so that the second film part contacts the first film part.

For example, in some embodiments, the first panel part includes a display unit which includes a plurality of pixels, each pixel including a light emission element and a pixel circuit.

For example, in some embodiments, the display device further comprises a flexible printed circuit board (PCB). The flexible PCB is connected to the second panel part.

At least one embodiment of the present disclosure also provides a method of manufacturing a display device, comprising: bonding a protective film to a surface on a non-display side of a flexible panel, in which the flexible panel includes a first panel part, a second panel part, and a bendable part connected between the first panel part and the second panel part; removing one part of the protective film to form a first film part bonded to the first panel part and a second film part bonded to the second panel part; and bending the bendable part so that the first panel part and the second panel part are overlapped in a first direction perpendicular to a surface on the non-display side. A distance from a first edge of the first film part near the second film part to a first boundary between the first panel part and the bendable part is a first distance; a distance from a second edge of the second film part near the first film part to a second boundary between the second panel part and the bendable part is a second distance, a sum of the first distance and the second distance is greater than 0, and both the first distance and the second distance are not less than 0.

For example, in some embodiments, the bending the bendable part includes: fixing one of the first panel part and the second panel part; and turning over the other one of the first panel part and the second panel part, so that a first alignment mark disposed in the first panel part and a second alignment mark disposed in the second panel part are aligned.

For example, in some embodiments, the first distance is equal to 0. The bending the bendable part includes: fixing the first panel part, and turning over the second panel part, so that the first alignment mark disposed in the first panel part and the second alignment mark disposed in the second panel part are aligned.

For example, in some embodiments, the second distance is equal to 0. The bending the bendable part includes: fixing the second panel part, and turning over the first panel part, so that the first alignment mark disposed in the first panel part and the second alignment mark disposed in the second panel part are aligned.

For example, in some embodiments, both the first distance and the second distance are greater than 0.

For example, in some embodiments, the method further comprises bonding a heat dissipation film to a side of the first film part away from the first panel part. The heat dissipation film covers the entire first film part.

For example, in some embodiments, at least one of the first distance or the second distance is within a range of greater than 0 and less than or equal to 200 μm.

BRIEF DESCRIPTION OF THE DRAWINGS

In order to more clearly explain the technical proposals of the embodiments of the present disclosure, the drawings in the embodiments will be briefly introduced below. It is to be understood that the following drawings only show some embodiments of the present disclosure, and therefore should not be regarded as a limitation on the scope of the application. Other related drawings may also be obtained by one of ordinary skill in the art on basis of these drawings without creative efforts.

DETAILED DESCRIPTION

To make the objectives, technical schemes and advantages clearer, technical schemes of the embodiments will be described in a clearly and fully understandable way in connection with the drawings related to the embodiments of the disclosure. Apparently, the described embodiments are a part but not all of the embodiments of the disclosure. Based on the described embodiments herein, one of ordinary skill in the art can obtain other embodiment(s), without any creative labor, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "left," "right," or the like are only used to indicate relative position relationship, and when the absolute position of the object which is described is changed, the relative position relationship may be changed accordingly.

Figure 10:
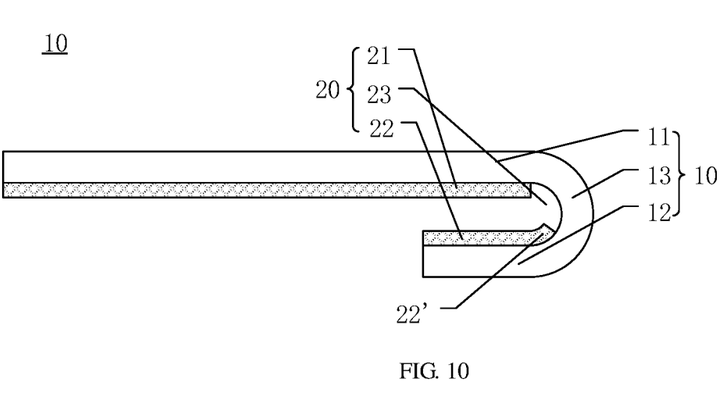
FIG. 10 is a sectional view of a display device.

FIG. 10 shows a display device 10. The display device 10 comprises a flexible panel 10 and a protective film 20. The flexible panel 10 includes a first panel part 11, a second panel part 12, and a bendable part 13 connected between the first panel part 11 and the second panel part 12. The flexible panel 10 includes a surface on a display side and a surface on a non-display side, and the surface on the display side is taken as a screen part that executes display function. The protective film 20 is bonded to the surface on the non-display side of the flexible panel 10, and includes a first film part 21 basically bonded to the first panel part 11 and a second film part 22 basically bonded to the second panel part 12. The flexible panel 10 is bent at the bendable part 13 so that the first panel part 11 and the second panel part 12 are overlapped with each other in a first direction perpendicular to the surface of the flexible panel 10. An opening 23 corresponding to the bendable part 13 is formed between the first film part 21 and the second film part 22 to reduce the damage on the flexible panel 10 due to the stress difference between the protective film 20 and the flexible panel 10.

However, as shown in FIG. 10, for instance, due to the cutting tolerance generated in the process of cutting the opening 23 and the alignment tolerance generated in the process of bending the bendable part 13, one section 22' of the second film part 22 will be bent together with the bendable part 13, which may cause the damage (such as breakage) on, for instance, sections near the section 22' of the bendable part 13.

Some embodiments of the present disclosure provide a display device, which comprises a flexible panel and a protective film. The flexible panel includes a first panel part, a second panel part, and a bendable part connected between the first panel part and the second panel part. The protective film is bonded to a surface on a non-display side of the flexible panel, and includes a first film part bonded to the first panel part and a second film part bonded to the second panel part. The flexible panel is bent at the bendable part so that the first panel part and the second panel part are overlapped with each other in a first direction perpendicular to the surface. A distance from a first edge of the first film part near the second film part to a first boundary between the first panel part and the bendable part is a first distance; a distance from a second edge of the second film part near the first film part to a second boundary between the second panel part and the bendable part is a second distance, a sum of the first distance and the second distance is greater than 0, and both the first distance and the second distance are not less than 0.

As the sum of the first distance and the second distance is greater than 0 and both the first distance and the second distance are not less than 0, in the process of bending the bendable part, the situation that the first film part and the second film part are bent together with the bendable part can be avoided, so as to avoid the damage on the bendable part and improve the quality and prolong the service life of the display device.

Figure 1A:
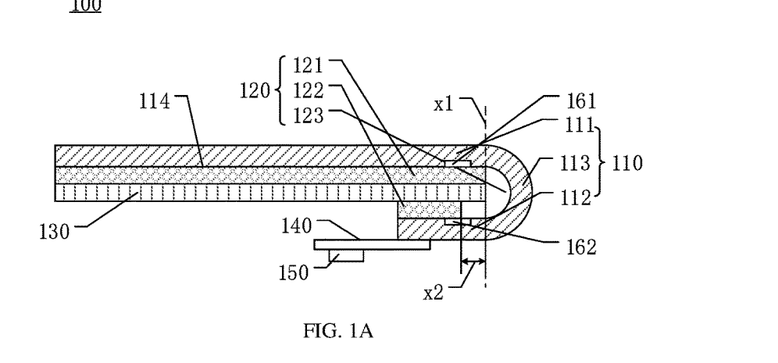
FIG. 1A is a sectional view of a display device provided by an embodiment of the present disclosure.

FIG. 1A is a sectional view of a display device 100 provided by an embodiment of the present disclosure. As shown in FIG. 1A, the display device 100 comprises a flexible panel 110, a protective film 120 and a heat dissipation film 130. The flexible panel 10 includes a surface on a display side and a surface on a non-display side. The surface on the display side is configured as a screen part that executes display function, and can be viewed by users in the use process; and the surface on the non-display side does not have display function, and may be not viewed by users in the use process.

The flexible panel 110 includes a first panel part 111, a second panel part 112, and a bendable part 113 connected between the first panel part 111 and the second panel part 112. The flexible panel 110 may be bent at the bendable part 113 so that the first panel part 111 and the second panel part 112 are overlapped with each other.

Figure 1B:
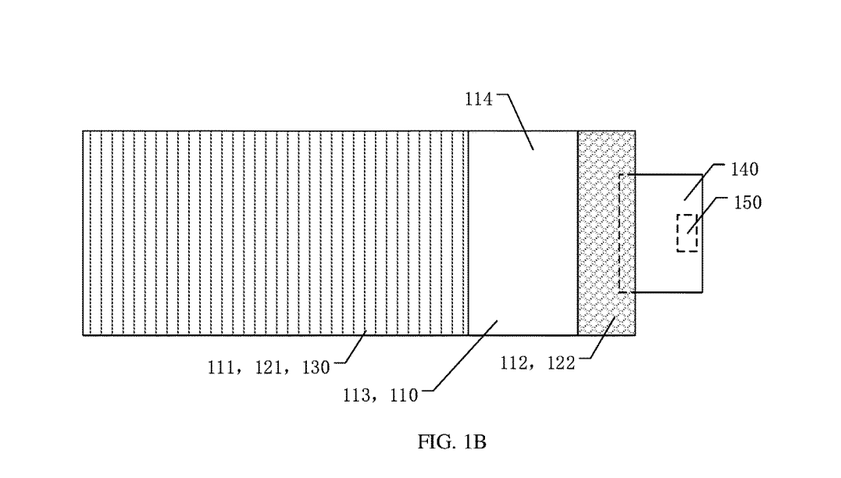
FIG. 1B is a top view of the display device in FIG. 1A before a bendable part is bent.

FIG. 1B is a top view (viewed from the non-display side) of the display device 100 in FIG. 1A before the bendable part 113 is bent. As shown in FIGS. 1A and 1B, the protective film 120 is bonded to a surface 114 on the non-display side of the flexible panel 110, and includes a first film part 121 bonded to the first panel part 111 and a second film part 122 bonded to the second panel part 112. The first panel part 111 and the second panel part 112 are overlapped with each other in a first direction perpendicular to the surface 114. An opening 123 is formed between the first film part 121 and the second film part 122. The opening 123 may be formed by cutting. For instance, a complete protective film 120 is bonded to the entire surface 114, and then a part at the opening 123 of the complete protective film 120 is cut to form the first film part 121 and the second film part 122. The opening 123 may be a closed opening, so that the first film part 121 and the second film part 122 can be connected with each other through other film parts. Or, the opening 123 may be a non-closed opening (as shown in FIG. 1B), so that the first film part 121 and the second film part 122 are separated from each other.

The protective film 120 is configured to support and protect the flexible panel 110. For instance, the protective film 120 may be made from materials such as polyethylene terephthalate (PET) or polyimide (PI). For instance, the protective film 120 is transparent. In addition, the protective film 120 may be bonded to the surface 114 of the flexible panel 110 through a bonding layer (not shown). The bonding layer, for instance, may be formed by optically clear adhesive (OCA).

A distance from a first edge of the first film part 121 near the second film part 122 to a first boundary between the first panel part 111 and the bendable part 113 is a first distance x1. A distance from a second edge of the second film part 122 near the first film part 121 to a second boundary between the second panel part 112 and the bendable part 113 is a second distance x2. A sum of the first distance x1 and the second distance x2 is greater than 0, and both the first distance x1 and the second distance x2 are not less than 0. The first panel part 111 is at least straight near the first boundary, namely the curvature of the first panel part 111 is 0; the bendable part 113 is at least curved near the first boundary, namely the curvature of the bendable part is not 0; the second panel part 112 is at least straight near the second boundary, namely the curvature of the second panel part 112 is 0; and the bendable part 113 is at least curved near the second boundary, namely the curvature of the bendable part 113 is not 0.

In the embodiment, the first distance x1 is equal to 0, and the second distance x2 is greater than 0. In the process of bending the bendable part 113, the first panel part 111 and the first film part 121 bonded on the first panel part 111 may be fixed at first, and then the bendable part 113 is bent so that the first panel part 111 and the second panel part 112 are overlapped in the first direction. As the second distance is designed to be greater than 0, the situation that the second film part 122 bonded to the second panel part 112 is bent together with the bendable part 113 can be avoided.

In the embodiment, in order to more accurately execute the bending operation, the flexible panel 110 further includes a first alignment mark 161 disposed in the first panel part 111 and a second alignment mark 162 disposed in the second panel part 112. In the process of bending the bendable part 113, the first alignment mark 161 and the second alignment mark 162 are aligned. The first alignment mark 161 and the second alignment mark 162 are positioned as that in the case that the distance of the first panel part 111 and the second panel part 112 in the first direction is determined, when the first alignment mark 161 and the second alignment mark 162 are aligned, the second distance x2 is realized. The shape of the first alignment mark 161 and the second alignment mark 162 may be same or complementary. For instance, the shape of the first alignment mark 161 and the second alignment mark 162 may be a same cross pattern. Or the first alignment mark 161 is a cross pattern, and the second alignment mark 162 includes a same cross opening. The first alignment mark 161 and the second alignment mark 162 are designed to be able to be viewed from the non-display side of the flexible panel 110, for example, the alignment marks are disposed on the surface 114 on the non-display side of the flexible panel, so as to allow the first alignment mark 161 and the second alignment mark 162 to be aligned.

As described above, the opening 123 between the first film part 121 and the second film part 122 may be formed by cutting. In the process of manufacturing the display device, one of the first panel part 111 and the second panel part 112 may be fixed and the other one is turned over, and meanwhile, the first alignment mark 161 and the second alignment mark 162 are aligned. However, actually, the width of the opening 123 (namely the distance between the first film part 121 and the second film part 123 in a second direction perpendicular to the first direction and the first boundary) is affected by the cutting tolerance, the relative position between the first panel part 111 and the second panel part 112 in the second direction is affected by the alignment tolerance between the first alignment mark 161 and the second alignment mark 162. So, the sum of the first distance x1 and the second distance x2 is set to be greater than zero, in which both the first distance x1 and the second distance x2 are not less than 0 so as to avoid the protective film 120 being bent together with the bendable part 113. At least one of the first distance x1 or the second distance x2 may be determined on basis of the cutting tolerance and the alignment tolerance. For instance, in the embodiment, when the first panel part 111 is fixed and the second panel part 112 is turned over, the second distance x2 is equal to the sum of the absolute value of the maximum alignment deviation for aligning the first alignment mark 161 and the second alignment mark 162 and the absolute value of the maximum preparation deviation of the width of the opening 123 between the first film part 121 and the second film part 122. In addition, the second distance x2 may also be designed to be greater than the sum of the absolute value of the maximum alignment deviation for aligning the first alignment mark 161 and the second alignment mark 162 and the absolute value of the maximum preparation deviation of the width of the opening 123 between the first film part 121 and the second film part 122. For instance, the second distance may be greater than 0 and less than or equal to 500 µm, or greater than 0 and less than or equal to 300 µm, or greater than 0 and less than or equal to 100 µm, or greater than 100 µm and less than or equal to 200 µm. In the embodiment, the first distance x1 may be equal to 0.

In other embodiments, the second distance x2 may be determined by considering other tolerances or other factors, for example, the alignment tolerance of the first film part 121, that is, the tolerance of the first distance x1 of the first edge of the first film part 121 from the first boundary.

It is to be noted that the first edge of the first film part 121 and the first boundary may be at an angle of not 0, that is, the first edge may be inclined to the first boundary. Or the first edge of the first film part 121 may be in an irregular shape, such as a zigzag shape. In this case, the first distance x1 refers to the minimum distance of the first edge of the first film part 121 from the first boundary. In addition, similarly, the second distance x2 refers to the minimum distance of the second edge of the second film part 122 from the second boundary.

The heat dissipation film 130 may be disposed between the first film part 121 and the second film part 122. For instance, the heat dissipation film 130 basically covers the entire first film part 121 and is configured to dissipate heat generated by the first panel part 111. For instance, the heat dissipation film 130 may be only bonded to the first film part 121 or may be bonded to both the first film part 121 and the second film part 122. For instance, the heat dissipation film 130 may be a graphite heat dissipation film, a nanocarbon heat dissipation film, etc. For instance, in the embodiment, the heat dissipation film 130 is a composite material including foam, copper foil, graphite and EMBO glue.

In the case of nontransparent heat dissipation film 130, the heat dissipation film 130 may shield the first alignment mark 161 and the second alignment mark 162. Therefore, the heat dissipation film basically covers the entire first film part 121, but the heat dissipation film 130 is designed to be dislocated with the first alignment mark 161 and the second alignment mark 162, so that the first alignment mark 161 and the second alignment mark 162 will not be shielded by the heat dissipation film 130.

Figure 9:
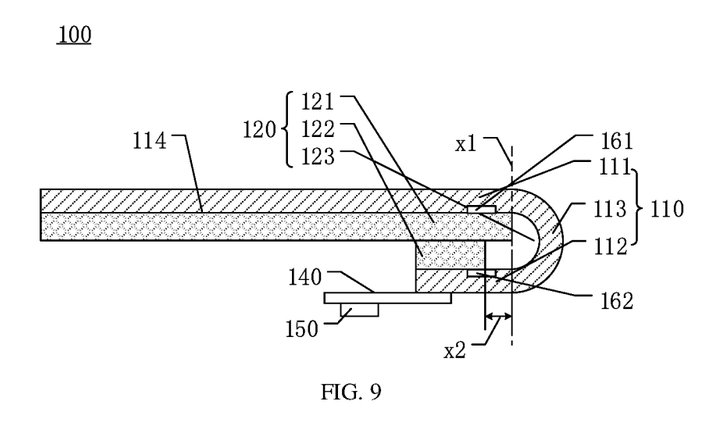
FIG. 9 is a sectional view of a display device provided by another embodiment of the present disclosure.

In another embodiment, the first film part 121 and the second film part 122 may contact each other, and the heat dissipation film 130 is not provided, as shown in FIG. 9. In addition, in another embodiment, specific components may be disposed between the first film part 121 and the second film part 122 as required. The distance between the first panel part 111 and the second panel part 112 in the first direction is determined according to the thickness of these components.

Figure 2:
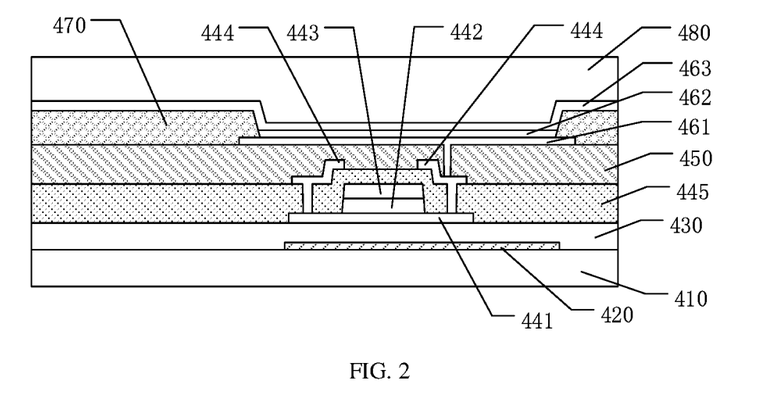
FIG. 2 is a partial sectional view of a display unit of a first panel part in FIG. 1A.

The first panel part 111 includes a display area provided on the surface on the display side. The display area includes display units. The display unit includes a plurality of pixels arranged in an array. The plurality of pixels emit light in the display area towards the display side of the flexible panel 110 relative to the non-display side, so as to display an image. FIG. 2 is a partial sectional view of the display unit of the first panel part 111 in FIG. 1A. As shown in FIG. 2, each pixel includes a light emission element and a pixel circuit. The pixel circuit, for instance, includes a thin-film transistor (TFT), etc. The light emission element, for instance, includes an organic light-emitting diode (OLED). The embodiment of the present disclosure does not limit the type of the display unit. For example, the display unit may be an OLED display unit, or it may be a quantum light-emitting diode (QLED) display unit, etc.

As shown in FIG. 2, the first panel part 111 includes a base 410, a light shielding part 420, a TFT, an OLED and an encapsulated layer 480. The TFT includes an active layer 441, a gate electrode 443, and source/drain electrodes 444. The OLED includes a first driving electrode 461, a second driving electrode 463, and an emission layer (EML) 462 disposed between the first driving electrode 461 and the second driving electrode 463. A plurality of insulating layers are disposed between electrode layers, respectively. The plurality of insulating layers may include a buffer layer 430, a gate insulation layer 442, an intermediate dielectric layer 445, a planarization layer 450, a pixel define layer (PDL) 470, etc.

The flexible panel 110 of the display device provided by the embodiment is an OLED display panel. As described above, in other embodiments, the flexible panel 110 may also be a light-emitting diode (LED) display panel, a QLED display panel, etc. In other embodiments, the first panel part 111 may have other structures, and the embodiment of the present disclosure is not limited thereto. For instance, the first panel part 111 may also include a capacitor, a touch electrode layer, a polarizer, etc.

In addition, as shown in FIGS. 1A and 1B, the display device further comprises a flexible PCB 140 and a circuit element 150 (for example, an integrated circuit (IC) element). The flexible PCB 140 is, for instance, connected or bonded to the second panel part 112 through an anisotropic conductive film (ACF). The circuit element 150 is electrically connected or mechanically connected to the second panel part 112 through the flexible PCB 140. The circuit element 150 may be an IC chip, for example, an IC chip configured for realizing display function or touch function. The IC chip may also be mounted on the flexible PCB 140 by appropriate encapsulation ways.

Figure 3:
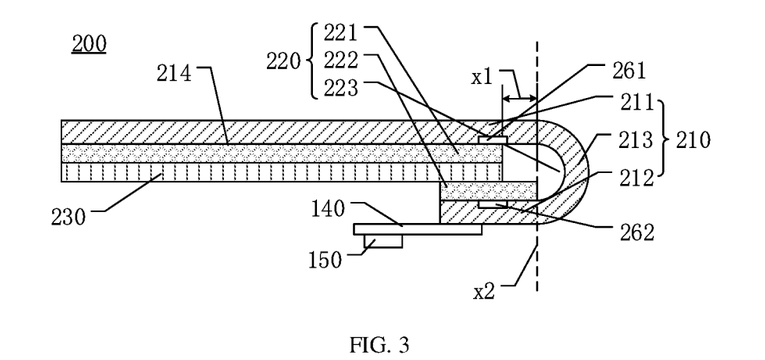
FIG. 3 is a sectional view of a display device provided by another embodiment of the present disclosure.

FIG. 3 is a sectional view of a display device 200 provided by another embodiment of the present disclosure.

As shown in FIG. 3, the display device 200 comprises a flexible panel 210, a protective film 220, a heat dissipation film 230, a flexible PCB 240 and a circuit element 250.

The flexible panel 210 includes a first panel part 211, a second panel part 212, and a bendable part 213 connected between the first panel part 211 and the second panel part 212. The flexible panel 210 is bent at the bendable part 213 so that the first panel part 211 and the second panel part 212 are overlapped with each other. The flexible panel 210 further includes a first alignment mark 261 disposed in the first panel part 211 and a second alignment mark 262 disposed in the second panel part 212. In the process of bending the bendable part 213, the first alignment mark 261 and the second alignment mark 262 are aligned in a direction in which the first panel part 211 and the second panel part 212 are overlapped with each other.

The protective film 220 is bonded to a surface 214 on a non-display side of the flexible panel 210, and the protective film 220 includes a first film part 221 bonded to the first panel part 211 and a second film part 222 bonded to the second panel part 212. An opening 223 is formed between the first film part 221 and the second film part 222.

A distance from a first edge of the first film part 221 near the second film part 222 to a first boundary between the first panel part 211 and the bendable part 213 is a first distance x1. A distance from a second edge of the second film part 222 near the first film part 221 to a second boundary between the second panel part 212 and the bendable part 213 is a second distance x2. A sum of the first distance x1 and the second distance x2 is greater than 0, and both the first distance x1 and the second distance x2 are not less than 0. The first panel part 211 is at least straight near the first boundary, namely the curvature of the first panel part is 0; the bendable part 213 is at least curved near the first boundary, namely the curvature of the bendable part is not 0; the second panel part 212 is at least straight near the second boundary, namely the curvature of the second panel part is 0; and the bendable part 213 is at least curved near the second boundary, namely the curvature of the bendable part is not 0.

The difference from the display device 100 is that, in the display device 200, the second distance x2 is equal to 0, and the first distance x1 is greater than 0.

For instance, in the process of manufacturing the display device 200, the second panel part 212 may be fixed and the first panel part 211 may be bent. Because the first distance x1 is greater than 0, the situation that the protective film 220 is bent together with the bendable part 213 can be avoided.

For instance, when the second panel part 211 is fixed and the first panel part 212 is turned over, the first distance x1 is greater than or equal to the sum of the absolute value of the maximum alignment deviation for aligning the first alignment mark 261 and the second alignment mark 262 and the absolute value of the maximum preparation deviation of the width of the opening 223 between the first film part 221 and the second film part 222.

For instance, the first distance x1 may be greater than 0 and less than or equal to 500 µm, or greater than 0 and less than or equal to 300 µm, or greater than 0 and less than or equal to 100 µm, or greater than 100 µm and less than or equal to 200 µm. In the embodiment, the second distance x2 is equal to 0.

Figure 4:
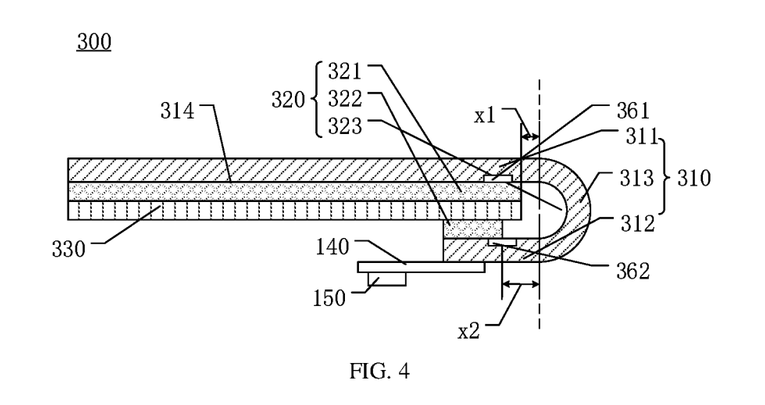
FIG. 4 is a sectional view of a display device provided by another embodiment of the present disclosure.

FIG. 4 is a sectional view of a display device 300 provided by another embodiment of the present disclosure.

As shown in FIG. 4, the display device 300 comprises a flexible panel 310, a protective film 320, a heat dissipation film 330, a flexible PCB 340 and a circuit element 350.

The flexible panel 310 includes a first panel part 311, a second panel part 312, and a bendable part 313 connected between the first panel part 311 and the second panel part 312. The flexible panel 310 is bentable at the bendable part 313 so that the first panel part 311 and the second panel part 312 are overlapped with each other. The flexible panel 310 further includes a first alignment mark 361 disposed in the first panel part 311 and a second alignment mark 362 disposed in the second panel part 312. In the process of bending the bendable part 313, the first alignment mark 361 and the second alignment mark 362 are aligned.

The protective film 320 is bonded to a surface 314 on a non-display side of the flexible panel 310, and the protective film 320 includes a first film part 321 bonded to the first panel part 311 and a second film part 322 bonded to the second panel part 312. An opening 323 is formed between the first film part 321 and the second film part 322.

A distance from a first edge of the first film part 321 near the second film part 322 to a first boundary between the first panel part 311 and the bendable part 313 is a first distance x1. A distance from a second edge of the second film part 322 near the first film part 321 to a second boundary between the second panel part 312 and the bendable part 313 is a second distance x2. A sum of the first distance x1 and the second distance x2 is greater than 0, and both the first distance x1 and the second distance x2 are not less than 0. The first panel part 311 is at least straight near the first boundary, namely the curvature of the first panel part 311 is 0; the bendable part 313 is at least curved near the first boundary, namely the curvature of the bendable part 313 is not 0. The second panel part 312 is at least straight near the second boundary, namely the curvature of the second panel part 312 is 0; and the bendable part 313 is at least curved near the second boundary, namely the curvature of the bendable part is not 0.

The difference from the display device 100 is that, in the display device 300, both the first distance x1 and the second distance x2 are greater than 0.

For instance, in the process of manufacturing the display device 300, one of the first panel part 311 and the second panel part 312 may be fixed and the other one may be bent. Because both the first distance x1 and the second distance x2 are greater than 0, the protective film 320 is avoided to be bent together with the bendable part 313.

For instance, when the first panel part 311 is fixed and the second panel part 312 is turned over, the second distance x2 may be greater than 0 and less than or equal to 500 µm, or greater than 0 and less than or equal to 300 µm, or greater than 0 and less than or equal to 100 µm, or greater than 100 µm and less than or equal to 200 µm. For instance, when the second panel part 312 is fixed and the first panel part 311 is turned over, the first distance x1 may be greater than 0 and less than or equal to 500 µm, or greater than 0 and less than or equal to 300 µm, or greater than 0 and less than or equal to 100 µm, or greater than 100 µm and less than or equal to 200 µm. Or, for instance, both the first distance x1 and the second distance x2 may be greater than 0 and less than or equal to 500 µm, or greater than 0 and less than or equal to 300 µm, or greater than 0 and less than or equal to 100 µm, or greater than 100 µm and less than or equal to 200 µm.

Some embodiments of the present disclosure further provide a method of manufacturing a display device.

Figure 5:
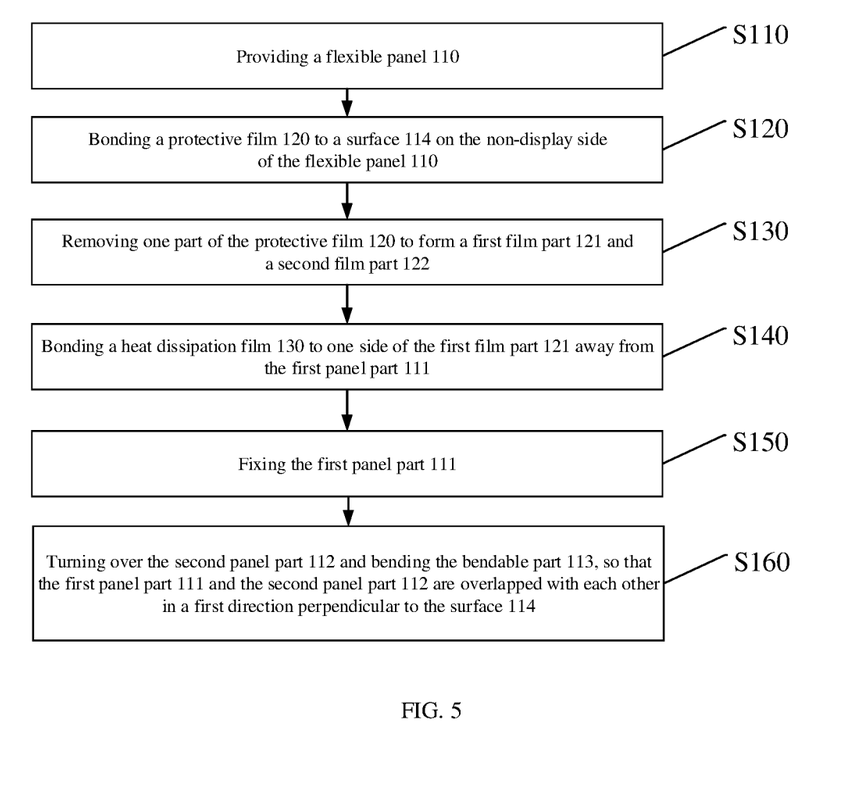
FIG. 5 is a flowchart of a method of manufacturing a display device provided by an embodiment of the present disclosure.
Figure 6A:
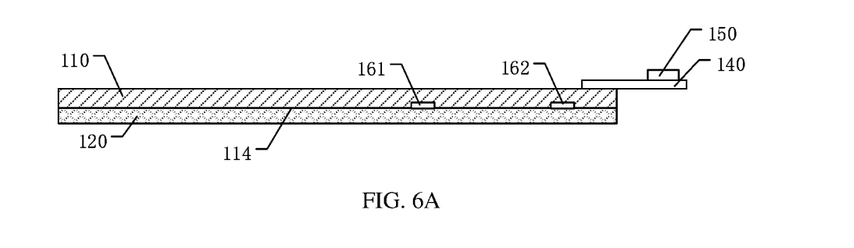
FIGS. 6A to 6C illustrate steps of the method of manufacturing the display device provided by the embodiment of the present disclosure.
Figure 6B:
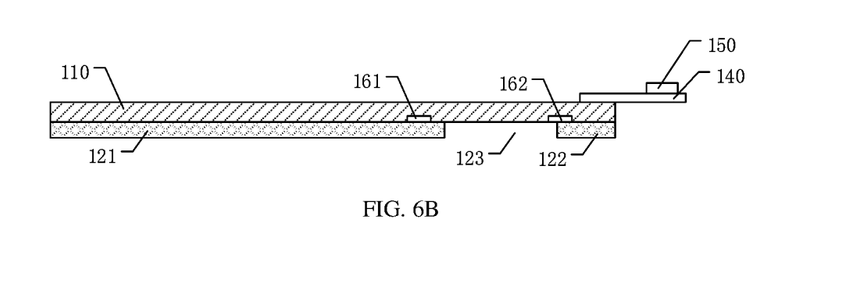
Figure 6C:
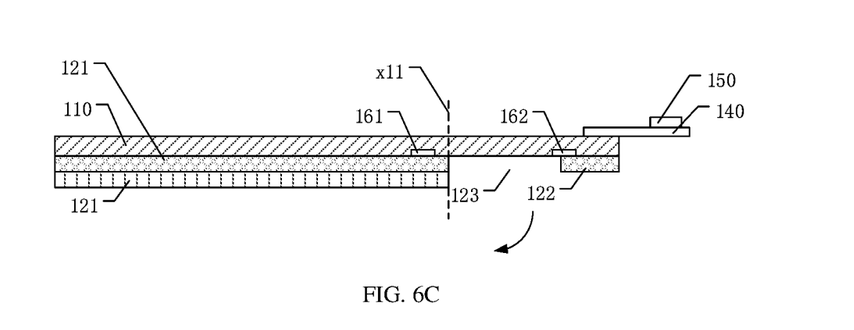

FIG. 5 is a flowchart of a method of manufacturing a display device provided by an embodiment of the present disclosure. FIGS. 6A-6C illustrate steps of the method of manufacturing the display device provided by an embodiment of the present disclosure. For instance, the method of manufacturing the display device may be used for manufacturing the above display devices 100 and 300. The method of manufacturing the display device provided by the embodiment will be described below by using the display device 100 as an example.

As shown in FIGS. 5 to 6C, the manufacturing method of the display device comprises steps S110-S160.

In the step S110: providing a flexible panel 110, in which the flexible panel 110 includes a display side and a non-display side, and includes a first panel part 111, a second panel part 112, and a bendable part 113 to be bent and connected between the first panel part 111 and the second panel part 112.

In the step S120: bonding a complete protective film 120 to a surface 114 on the non-display side of the flexible panel 110, as shown in FIG. 6A.

In the step S130: removing one part of the protective film 120 to form a first film part 121 bonded to the first panel part 111 and a second film part 122 bonded to the second panel part 112, as shown in FIG. 6B. For instance, one part of the protective film 120 may be removed by cutting the protective film 120.

Alternatively, in the steps S120 and S130, a protective film 120 including a first film part 121, a second film part 122, and an opening 123 between the first film part 121 and the second film part 122 are directly provided, and the protective film 120 is bonded to the flexible panel 110. The protective film 120 bonded to the flexible panel 110 has been cut to form the opening 123 before bonding.

In the step S140: bonding a heat dissipation film 130 to one side of the first film part 121 away from the first panel part 111, as shown in FIG. 6C.

In the step S150: fixing the first panel part 111 so that a first distance is formed from a first edge of the first film part 121 near the second film part 122 to a first boundary between the first panel part 111 and the bendable part 113. For instance, the first distance x1 is equal to 0.

In the step S160: in the case of fixing the first panel part 111, turning over the second panel part 112 and bending the bendable part 113 in a direction as shown by an arrow in FIG. 6C, so that the first alignment mark 161 disposed in the first panel part 111 and the second alignment mark 162 disposed in the second panel part 112 are aligned, and the first panel part 111 and the second panel part 112 are overlapped with each other in a first direction perpendicular to the surface 114.

In the step S160, after the bendable part 113 is bent, a second edge of the second film part 122 near the first film part 121 is designed to be a second distance x2 from a second boundary between the second panel part 112 and the bendable part 113. The second distance x2 is greater than 0.

Because the second distance is greater than 0, the second film part 122 of the protective film 120 is avoided to bent together with the bendable part 113.

It is to be noted that the above steps may be executed in parallel or in other orders. Moreover, one or more steps in the above steps may be omitted.

Figure 7:
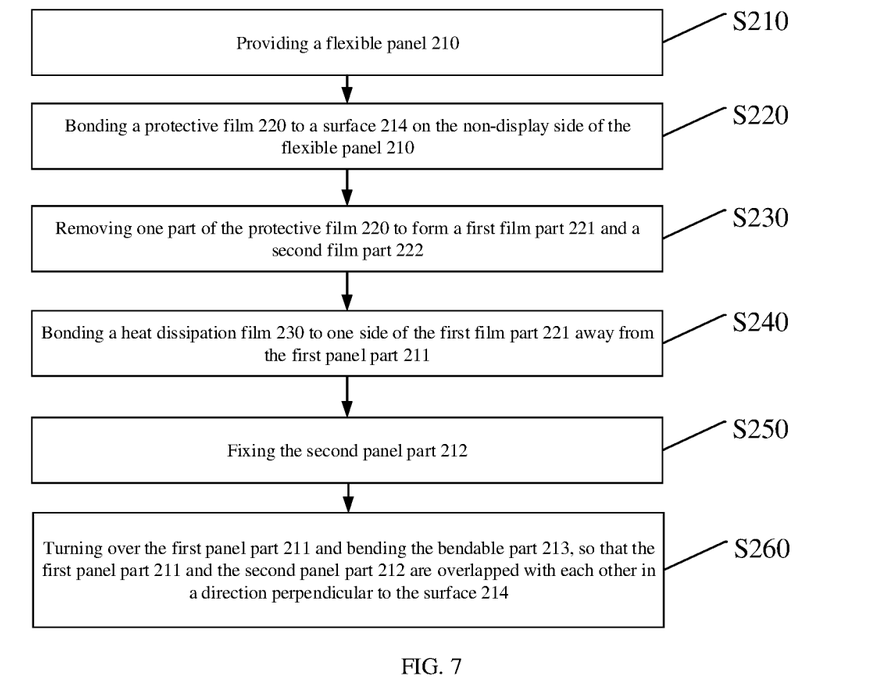
FIG. 7 is a flowchart of a method of manufacturing a display device provided by another embodiment of the present disclosure.
Figure 8A:
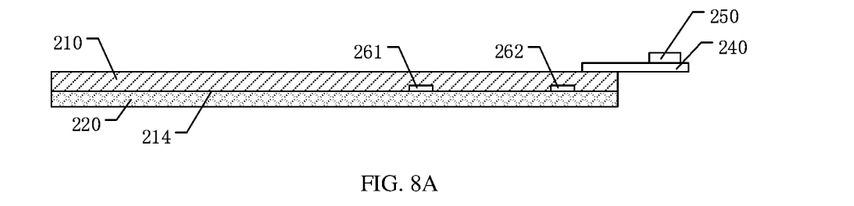
FIGS. 8A to 8C show steps of the method of manufacturing the display device provided by another embodiment of the present disclosure.
Figure 8B:
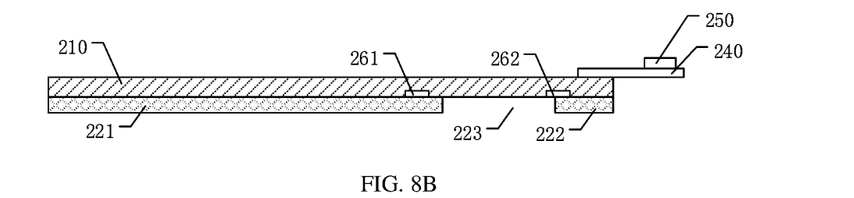
Figure 8C:
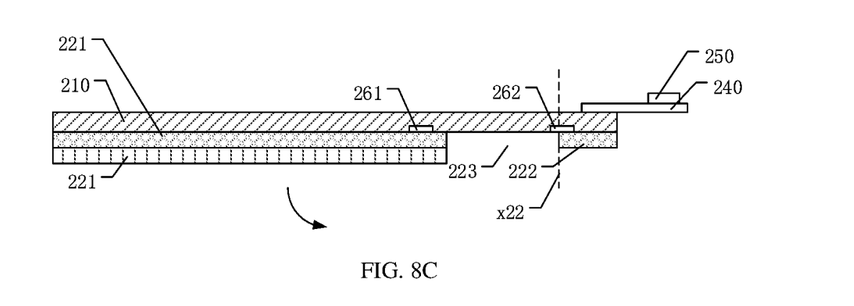

FIG. 7 is a flowchart of a method of manufacturing a display device provided by the embodiment of the present disclosure. FIGS. 8A-8C illustrate steps of the method of manufacturing the display device provided by the embodiment of the present disclosure. For instance, the method of manufacturing the display device can be used for manufacturing the above display devices 200 and 300. The method of manufacturing the display device provided by the embodiment will be described by using the display device 200 as an example.

As shown in FIGS. 7 to 8C, the manufacturing method of the display device 200 comprises steps S210-S260.

In the step S210: providing a flexible panel 210, in which the flexible panel 210 includes a display side and a non-display side, and the flexible panel includes a first panel part 211, a second panel part 212, and a bendable part 213 to be bent and connected between the first panel part 211 and the second panel part 212.

In the step S220: bonding a complete protective film 220 to a surface 214 on the non-display side of the flexible panel 210, as shown in FIG. 6A.

In the step S230: removing one part of the protective film 220 to form a first film part 221 bonded to the first panel part 211 and a second film part 222 bonded to the second panel part 212, as shown in FIG. 6B. For instance, one part of the protective film 220 may be removed by cutting the protective film 220.

Alternatively, in the steps S220 and S230, the protective film 220 including the first film part 221, the second film part 222, and an opening 223 between the first film part 221 and the second film part 222 is directly provided, and the protective film 220 is bonded to the flexible panel 210. The protective film 220 bonded to the flexible panel 210 has been cut to form the opening 223 before bonding.

In the step S240: bonding a heat dissipation film 230 to one side of the first film part 221 away from the first panel part 211, as shown in FIG. 6C.

In the step S250: fixing the second panel part 212 so that a second distance x2 is formed from a second edge of the second film part 222 near the first film part 221 to a second boundary between the second panel part 212 and the bendable part 213. For instance, the second distance x2 is equal to 0.

In the step S260: turning over the first panel part 211 and bending the bendable part 213 in a direction as shown by an arrow in FIG. 8C, so that the first alignment mark 261 disposed in the first panel part 211 and the second alignment mark 262 disposed in the second panel part 212 are aligned, and the first panel part 211 and the second panel part 212 are overlapped with each other in a direction perpendicular to the surface 214.

In the step S260, after the bendable part 213 is bent, a first edge of the first film part 221 near the second film part 222 is designed to be a first distance x1 from a first boundary between the first panel part 211 and the bendable part 213. The first distance x1 is greater than 0.

Because the first distance x1 is greater than 0, the first film part 221 of the protective film 220 is avoided to be bent together with the bendable part 213.

It is to be noted that the above steps may be executed in parallel or in other orders. Moreover, one or more steps in the above steps may be omitted.

The scope of the present disclosure is not limited by the embodiments described above, but by the appended claims and their equivalents.

What is claimed is:

1. A display device, comprising:
a flexible panel including a first panel part, a second panel part, and a bendable part connected between the first panel part and the second panel part; and
a protective film being bonded to a surface on a non-display side of the flexible panel and comprising a first film part bonded to the first panel part and a second film part bonded to the second panel part,
wherein
the flexible panel is bent at the bendable part so that the first panel part and the second panel part are overlapped in a first direction perpendicular to the surface;
a distance from a first edge of the first film part near the second film part to a first boundary between the first panel part and the bendable part is a first distance; a distance from a second edge of the second film part near the first film part to a second boundary between the second panel part and the bendable part is a second distance, a sum of the first distance and the second distance is greater than 0, and both the first distance and the second distance are not less than greater than 0,
wherein
the flexible panel also comprises a first alignment mark disposed in the first panel part and a second alignment mark disposed in the second panel part, the first alignment mark and the second alignment mark are configured for alignment in a process of bending the bendable part and
a heat dissipation film, wherein the heat dissipation film is disposed between the first film part and the second film part in the first direction, and covers the entire first film part.

2. The display device according to claim 1, wherein
at least one of the first distance or the second distance is greater than or equal to a sum of an absolute value of a maximum alignment deviation for aligning the first alignment mark and the second alignment mark and an absolute value of a maximum preparation deviation of a width of an opening between the first film part and the second film part.

3. The display device according to claim 2, wherein at least one of the first distance or the second distance is within a range of greater than 0 and less than or equal to 200 μm.

4. The display device according to claim 3, wherein the flexible panel is bent at the bendable part so that the second film part contacts the first film part.

5. The display device according to claim 4, wherein the first panel part comprises a display unit which comprises a plurality of pixels, each pixel comprising a light emission element and a pixel circuit.

6. The display device according to claim 5, further comprising, a flexible printed circuit board (PCB), wherein the flexible PCB is connected to the second panel part.

7. A method of manufacturing a display device, comprising:
bonding a protective film to a surface on a non-display side of a flexible panel, in which the flexible panel comprises a first panel part, a second panel part, and a bendable part connected between the first panel part and the second panel part;

removing one part of the protective film to form a first film part bonded to the first panel part and a second film part bonded to the second panel part; and bending the bendable part so that the first panel part and the second panel part are overlapped in a first direction perpendicular to a surface on the non-display side, wherein a distance from a first edge of the first film part near the second film part to a first boundary between the first panel part and the bendable part is a first distance; a distance from a second edge of the second film part near the first film part to a second boundary between the second panel part and the bendable part is a second distance, a sum of the first distance and the second distance is greater than 0, and both the first distance and the second distance are not less than 0, wherein the bending the bendable part comprises:

fixing one of the first panel part and the second panel part;

turning over the other one of the first panel part and the second panel part, so that a first alignment mark disposed in the first panel part and a second alignment mark disposed in the second panel part are aligned; and forming a heat dissipation film between the first film part and the second film part in the first direction, and the heat dissipation film covering the entire first film part.

8. The method according to claim 7, wherein
the first distance is equal to 0; and
the bending the bendable part comprises:
   fixing the first panel part; and
   turning over the second panel part, so that the first alignment mark disposed in the first panel part and the second alignment mark disposed in the second panel part are aligned.

9. The method according to claim 7, wherein
the second distance is equal to 0; and
the bending the bendable part comprises:
   fixing the second panel part; and
   turning over the first panel part, so that the first alignment mark disposed in the first panel part and the second alignment mark disposed in the second panel part are aligned.

10. The method according to claim 7, wherein both the first distance and the second distance are greater than 0.

11. The method according to claim 10, further comprising:
   bonding the heat dissipation film to a side of the first film part away from the first panel part.

12. The method according to claim 10, wherein at least one of the first distance or the second distance is within a range of greater than 0 and less than or equal to 200 μm.

* * * * *